US012580560B2

(12) United States Patent
Verd

(10) Patent No.: US 12,580,560 B2
(45) Date of Patent: Mar. 17, 2026

(54) RADIOFREQUENCY BLANKING SWITCH SYSTEM AND APPARATUS

(71) Applicant: The United States of America as represented by the Secretary of the Navy, San Diego, CA (US)

(72) Inventor: Frederick Joseph Verd, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 143 days.

(21) Appl. No.: 18/607,929

(22) Filed: Mar. 18, 2024

(65) Prior Publication Data

US 2025/0293682 A1     Sep. 18, 2025

(51) Int. Cl.
H03K 17/16 (2006.01)

(52) U.S. Cl.
CPC .................................... H03K 17/16 (2013.01)

(58) Field of Classification Search
CPC ...... H03K 17/693; H03K 17/96; H03K 17/00; H03K 17/007; H03K 17/102; H03K 17/162; H03K 17/94; H03K 17/9645; H03K 5/08; H03K 5/153; H03K 17/0822;

H01P 1/15; H01P 5/12; H01Q 1/50; H01Q 21/065; H01Q 3/24; H03H 11/245; H03H 11/28; H03H 11/30; H03H 11/32; H03H 7/25; H03H 7/40; H04B 1/0458; H04B 1/18; H04B 1/48; H04B 3/26; H04B 1/44; H04B 2001/485; H04B 1/04; H04B 1/006

See application file for complete search history.

(56) References Cited

U.S. PATENT DOCUMENTS 5,789,995 A * 8/1998 Minasi ...................... H03H 7/46
                                                   333/262
2021/0233876 A1* 7/2021 Igarashi ................ H01L 23/544

* cited by examiner

*Primary Examiner* — Lincoln D Donovan
*Assistant Examiner* — Tyler J Pereny
(74) *Attorney, Agent, or Firm* — Naval Information Warfare Center Pacific; Kyle Eppele

(57) ABSTRACT

A radiofrequency blanking switch system and/or apparatus, comprising: a control line further comprising a resistor, a plurality of diodes each further comprising two vias, and an inductor electrically connected in series; and a coupling layer electrically connected to each of the vias and broadside coupled to a transmission line, wherein the coupling layer is not physically connected to the transmission line and is adjacent to the transmission line for each of the plurality of diodes to induce an electromagnetic response in the transmission line.

18 Claims, 10 Drawing Sheets

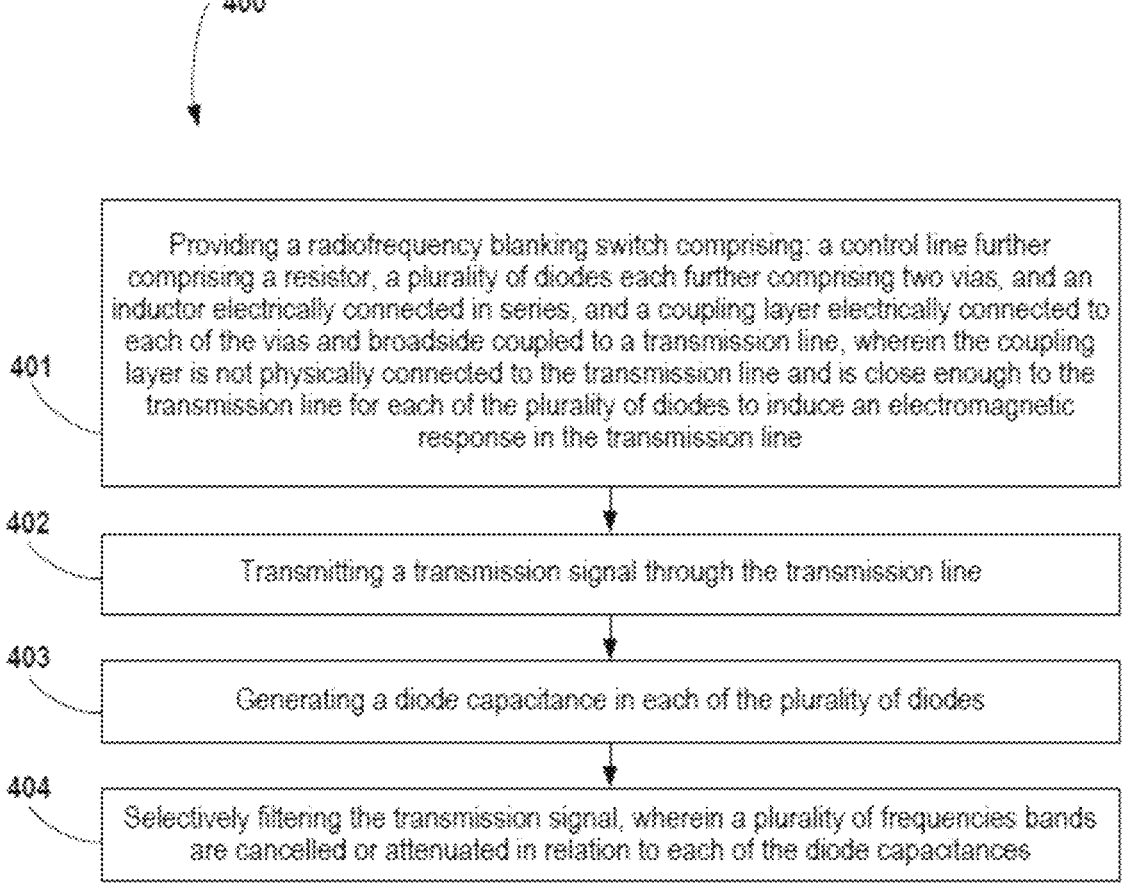

400

401    Providing a radiofrequency blanking switch comprising: a control line further comprising a resistor, a plurality of diodes each further comprising two vias, and an inductor electrically connected in series, and a coupling layer electrically connected to each of the vias and broadside coupled to a transmission line, wherein the coupling layer is not physically connected to the transmission line and is close enough to the transmission line for each of the plurality of diodes to induce an electromagnetic response in the transmission line 402    Transmitting a transmission signal through the transmission line 403    Generating a diode capacitance in each of the plurality of diodes 404    Selectively filtering the transmission signal, wherein a plurality of frequencies bands are cancelled or attenuated in relation to each of the diode capacitances

Fig. 4

RADIOFREQUENCY BLANKING SWITCH SYSTEM AND APPARATUS

STATEMENT REGARDING FEDERALLY-SPONSORED RESEARCH AND DEVELOPMENT

The United States Government has ownership rights in this invention. Licensing inquiries may be directed to Office of Research and Technical Applications Naval Information Warfare Center Pacific, Code 72120, San Diego, CA, 92152; telephone (619) 553-5118; email: NIWC_Pacific_T2@us.navy.mil, referencing Navy Case No. 211,251.

BACKGROUND

Transmission lines commonly use active components to blank or attenuate a carried signal. However, active components change the natural transmission line's electromagnetic mode and impedance, impacting both the signal's amplitude and phase. This is because active components are added in series, which physically touches the transmission line and affects the signal whether the device is on or off. These effects manifest when the active components change their capacitive responses and cause a radiofrequency (RF) spike on the transmission line. Furthermore, active components (including RF switches) require three direct current (DC) voltages: positive, negative, and ground. There is a continuous desire to make such components smaller, simpler, and more efficient.

SUMMARY

According to illustrative embodiments, a radiofrequency blanking switch system, comprising: a control line further comprising a resistor, a plurality of diodes each further comprising two vias, and an inductor electrically connected in series; and a coupling layer electrically connected to each of the vias and broadside coupled to a transmission line, wherein the coupling layer is not physically connected to the transmission line and is close enough to the transmission line for each of the plurality of diodes to induce an electromagnetic response in the transmission line.

Additionally, a radiofrequency blanking switch apparatus, comprising: a control line further comprising a resistor, a plurality of diodes each further comprising two vias, and an inductor electrically connected in series; and a coupling layer electrically connected to each of the vias and broadside coupled to a transmission line, wherein the coupling layer is not physically connected to the transmission line and is close enough to the transmission line for each of the plurality of diodes to induce an electromagnetic response in the transmission line.

Additionally, a method of using a radiofrequency blanking switch system, the steps comprising: providing a radiofrequency blanking switch, comprising: a control line further comprising a resistor, a plurality of diodes each further comprising two vias and a diode capacitance, and an inductor electrically connected in series, and a coupling layer electrically connected to each of the vias and broadside coupled to a transmission line, wherein the coupling layer is not physically connected to the transmission line and is close enough to the transmission line for each of the plurality of diodes to induce an electromagnetic response in the transmission line; transmitting a transmission signal through the transmission line; generating a diode capacitance in each of the plurality of diodes; and selectively filtering the transmission signal, wherein a plurality of frequencies bands are cancelled or attenuated in relation to each of the plurality of diode capacitances.

It is an object to provide a Radiofrequency Blanking Switch System and Apparatus that offers numerous benefits, including working as a frequency selective filter to blank or cancel a targeted frequency band. In doing so, an amplitude modulated signal is produced in the targeted band without affecting the DC current and frequencies outside of the targeted band.

It is an object to overcome the limitations of the prior art.

These, as well as other components, steps, features, objects, benefits, and advantages, will now become clear from a review of the following detailed description of illustrative embodiments, the accompanying drawings, and the claims.

BRIEF DESCRIPTION OF THE DRAWINGS

The accompanying drawings, which are incorporated in and form a part of the specification, illustrate example embodiments and, together with the description, serve to explain the principles of the invention. Throughout the several views, like elements are referenced using like references. The elements in the figures are not drawn to scale and some dimensions are exaggerated for clarity. In the drawings:

FIG. 4 is a block-diagram illustration of a method of using a radiofrequency blanking switch system.

DETAILED DESCRIPTION OF EMBODIMENTS

The disclosed apparatus, system, and method below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other apparatus, system, and method described herein as will be understood by one of ordinary skill in the art unless otherwise stated specifically.

References in the present disclosure to "one embodiment," "an embodiment," or any variation thereof, means that a particular element, feature, structure, or characteristic described in connection with the embodiments is included in at least one embodiment. The appearances of the phrases "in one embodiment," "in some embodiments," and "in other embodiments" in various places in the present disclosure are not necessarily all referring to the same embodiment or the same set of embodiments.

As used herein, the terms "comprises," "comprising," "includes," "including," "has," "having," or any variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of words such as "the," "a," or "an" are employed to describe elements and components of the embodiments herein; this is done merely for grammatical reasons and to conform to idiomatic English. This detailed description should be read to include one or at least one, and the singular also includes the plural unless it is clearly indicated otherwise.

Figure 1:
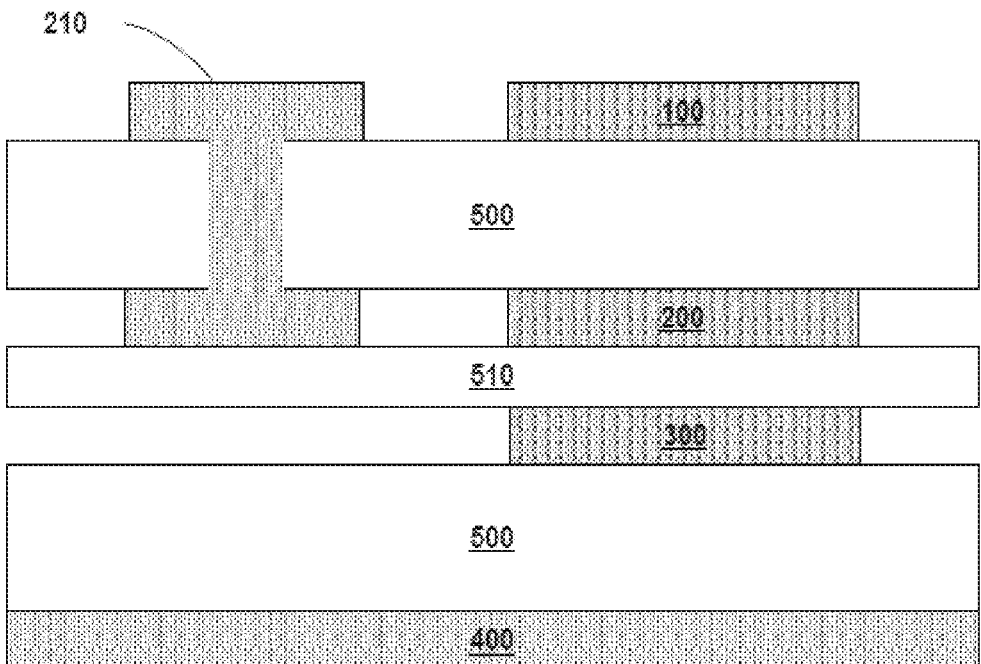
FIG. 1 is an illustration of a printed circuit board stack of an RF Blanking Switch System and Apparatus with a broadside coupled architecture.

FIG. 1 illustrates one embodiment of a RF Blanking Switch System and Apparatus having a broadside coupled architecture in a printed circuit board (PCB) stack. As shown in FIG. 1, the PCB stack may comprise, consist, or consist essentially of a control line 100, a coupling layer 200, a transmission line 300, and a ground layer 400 with interstitial substrates 500 and flexible circuit material (e.g. Bondply). The control line 100 may comprise, consist, or consist essentially of a single direct current voltage, a differential signal, or a digital signal. Additionally, there is a control via 210 that connects the control lines to the coupling layer 200 without touching the transmission line 300. This is a broadside coupling architecture wherein the RF Blanking Switch System comprising a control line 100, coupling layer 200, and control vias 210 runs parallel to the transmission line 300 at a close enough distance to induce a electromagnetic response, but does not touch the transmission line. When changing the capacitive responses of the active components from off, on, and no power, an electromagnetic response can be induced between the coupling layer 200 and the transmission layer 300 without causing an RF spike. In doing so, an amplitude modulated signal may be produced in a targeted frequency band. The DC current and frequencies outside the attenuated band may selectively not be affected.

An advantage of this disclosure is that the control signal for the RF Blanking Switch System and Apparatus is completely isolated. Where the control signal could be a DC voltage, a differential signal, or a digital signal. Furthermore, the RF Blanking Switch System and Apparatus only requires one direct current (DC) voltage, which may be used as a differential or digital control signal. When used as a differential signal, the response may be positive, negative, or no power. This advantage also allows 3 modes of operation— on off, and no power. Requiring only one direct current voltage is advantageous over systems requiring three DC voltages for reasons including design simplicity and efficiency.

Additionally, another advantage of a RF switching system is that it is not physically connected to the transmission line 300. In a lot of RF switches (like FETs in series), when the switch changes modes, it places an RF spike on the transmission line. Since the RF Switch System and Apparatus does not physically touch the transmission line, the switching control is smooth and non-transient. Instead, a broadside coupling affect may be used to cancel or attenuate the signal without a physical connection. The combination of the diode 220 capacitance and the coupling effect of the coupling layer determines the resonant frequency that is being attenuated on the transmission line.

Furthermore, the RF Blanking Switch System and Apparatus may be frequency tuned. This advantage may be particularly valuable to support finely tuned RF system or phased array antennas. In other words, it may target a frequency band in which it was designed to perform by, for example, selectively designing capacitance and current feed to the diode.

Figure 2A:
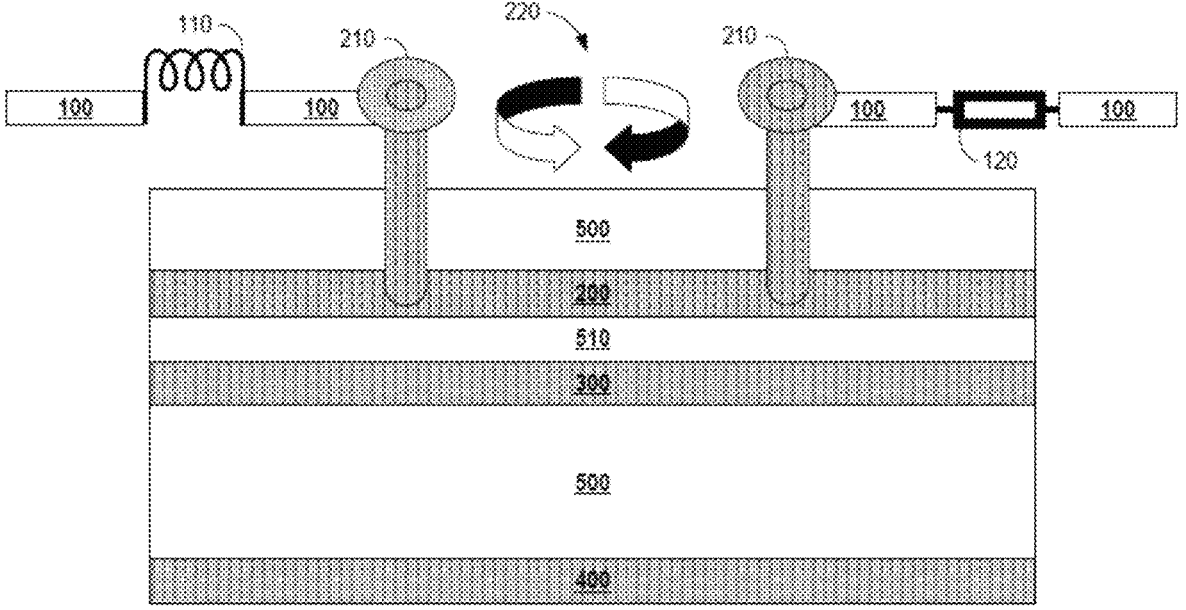
FIG. 2A illustrates one embodiment of a RF Blanking Switch System and Apparatus having a single loop.

FIG. 2A illustrates one embodiment of a RF Blanking Switch System and Apparatus having a single loop comprising, consisting, or consisting essentially of a control line 100, coupling layer 200, two vias 210, and a single diode 220, which is broadside coupled to a transmission line 300, ground layer 400, plurality of substrates 500, and a flexible circuit board material 510. Additionally, the control line 100 may further comprise an inductor 110 and a resistor 120. It is notable that the quantity of the vias 210 and diodes 220 are not so limited and there may be a plurality of diodes 220 each having two vias 210. The two vias 210 may connect a single diode 220 to small metal strips on the coupling layer 200 located directly adjacent the transmission line 300. "Adjacent" comprises a distance where the coupling layer 200 can induce an electromagnetic response in the transmission line 300. When the diode is switched on, a capacitive coupling from the coupling layer 200 may create an electromagnetic response with the transmission line 300 causing a cancellation or attenuation of a single frequency band along the transmission line 300. The capacitive coupling may be designed to blank, cancel, or attenuate a targeted frequency band in the transmission line 300.

Figure 2B:
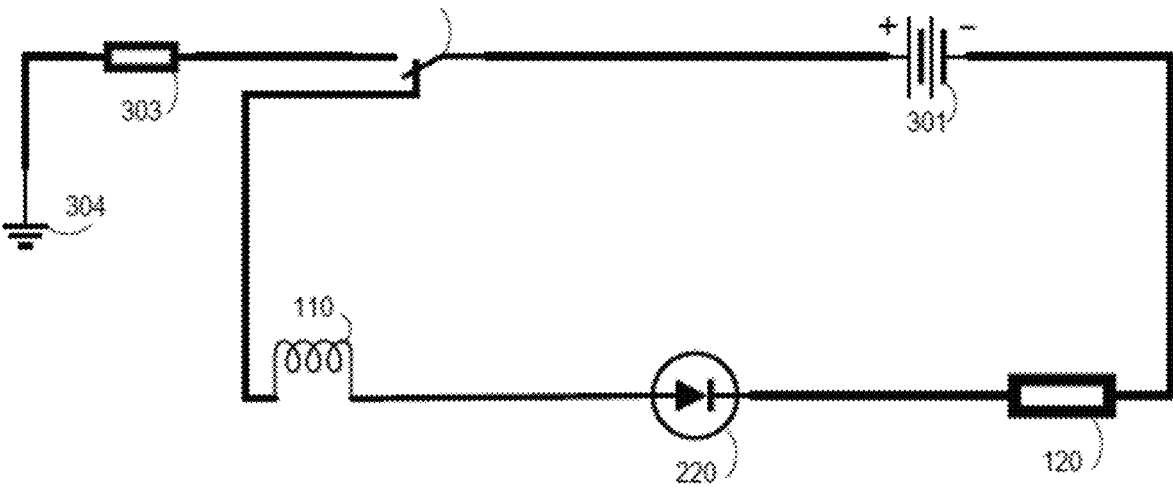
FIG. 2B is an exemplary schematic of a control circuit for turning the diode on and off in a RF Blanking Switch System and Apparatus.

FIG. 2B is an exemplary schematic of a control circuit for turning the diode 220 on and off in a RF Blanking Switch System and Apparatus comprising an inductor 110, a diode 220, a resistor 120, a voltage source 301, a switch 302, second resistor 303, and ground 304. The inductor 110 is electrically connected to the diode 220 and may be used as a direct current feed for the diode 220. The inductor 110, diode 220, and resistor 120 may be place in series as shown in FIG. 2B. The value of the inductor 110 may be selected to pass over untargeted frequencies, such as DC frequencies. This does not affect the coupling loop response of the single diode loop. The resistor 120 on the opposite side of the diode 220 limits the direct current to turn on the diode 220. The resistor value is selected to be low enough to turn on the diode 220, but not low enough to affect the single diode loop in this embodiment. For purpose of designing and selecting the appropriate resistor value and inductor value, the targeting of frequencies may be simulated with ideal short and open diode.

Figure 2C:
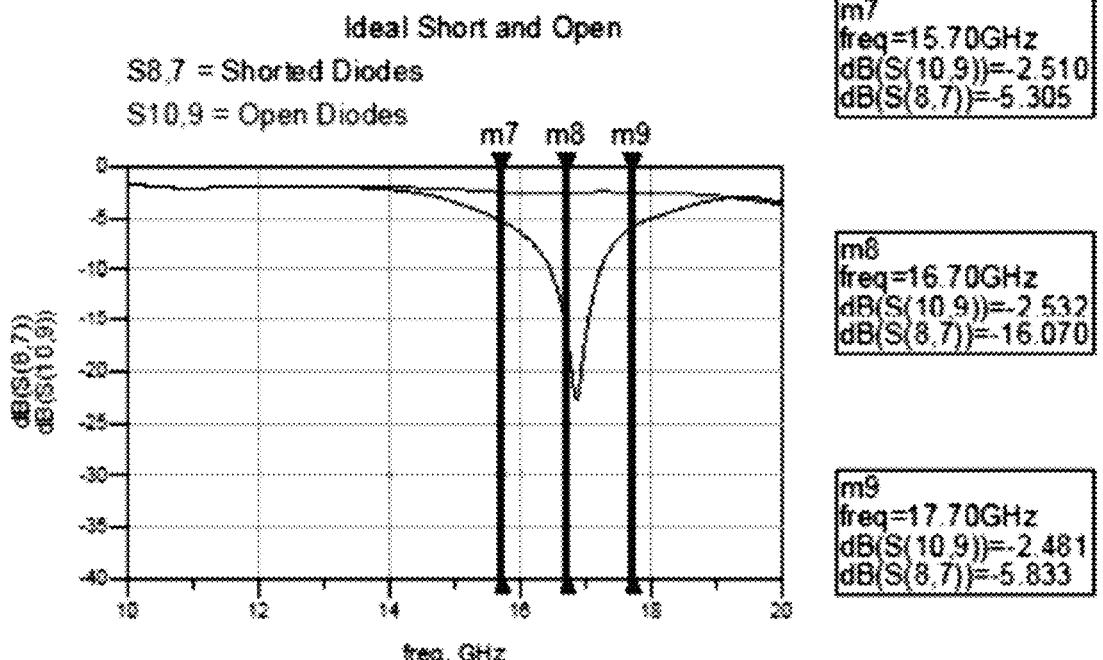
FIG. 2C shows a plot of a simulated response for one embodiment of a RF Blanking Switch System and Apparatus having a single diode.

FIG. 2C shows a plot of a simulated response for one embodiment of a RF Blanking Switch System and Apparatus having a single diode 220, wherein the diode 220 is simulated with an ideal short ("on") and an open. In this plot, the S10,9 Open Diodes is the upper line while the S8,7 Shorted diodes dip down. This exemplary plot is an extreme ideal response that a diode 220 would have when turned off and on. The shorted diode may be likened to a diode that is on. The open diode may show the response as if the diode was off. Additionally, the design of the diode 220 response may also consider a capacitive response of the diode 220, which is different with each model and diode manufacturer. As shown in the FIG. 2C, the shortened diodes 220 has a negative peak around a frequency of 17 GHz at around –22 dB.

Figure 2D:
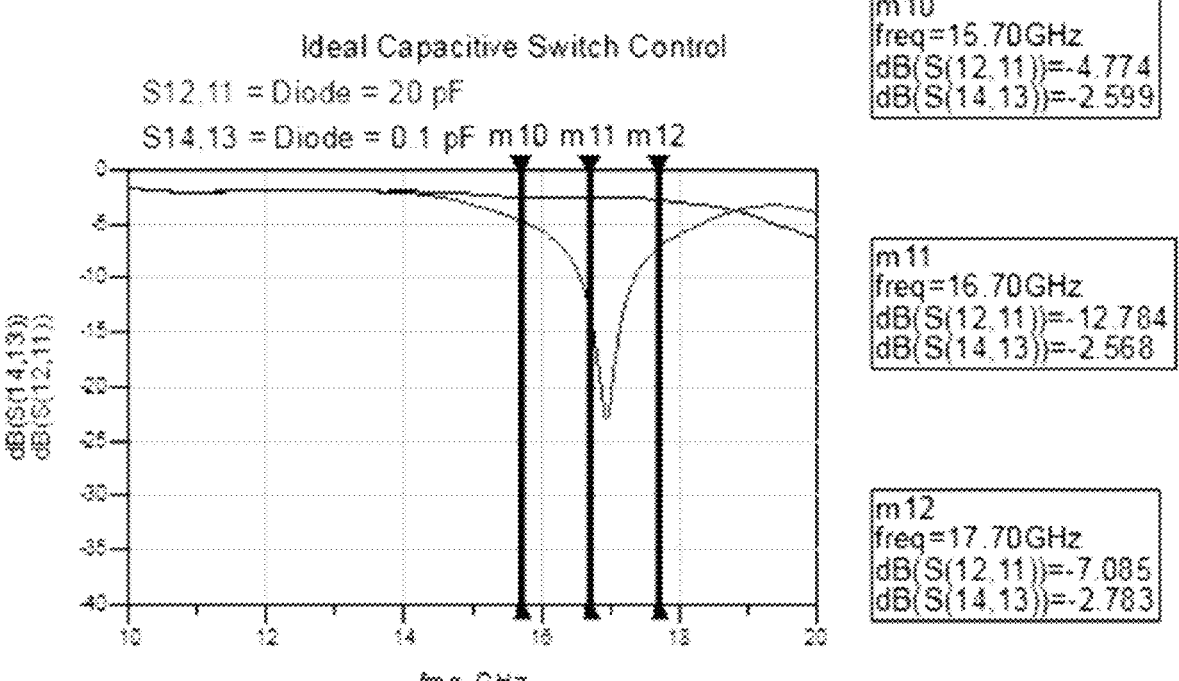
FIG. 2D shows a plot of a simulated response of the diode being replaced with a 20 picofarad (pF) and a 0.1 pF capacitor.

FIG. 2D shows a plot of a simulated response of the diode 220 being replaced with a 20 picofarad (pF) and a 0.1 pF capacitor. In this plot, the S14, 13 0.1 pF Diodes is the upper line while the S12, 11 20 pF diodes dips down. As compared to the plot in FIG. 2C, the 20 pF capacitor in FIG. 2D may be likened to the shorted diodes or diode on. The 0.1 pF capacitor in FIG. 2D may be likened to the open diode in FIG. 2C or diode off. The combination of the diode capacitance and the coupling effect of the coupling layer 200 may determine the resonant frequency that is being targeting for blanking or attenuation on the transmission line. The single diode loop may support targeting one resonant frequency. As shown in the FIG. 2D, the response of diode replaced with a 20 pF capacitor has a similar negative peak to FIG. 2C negative peak around a frequency of 17 GHz at around –22 decibels.

Figure 3A:
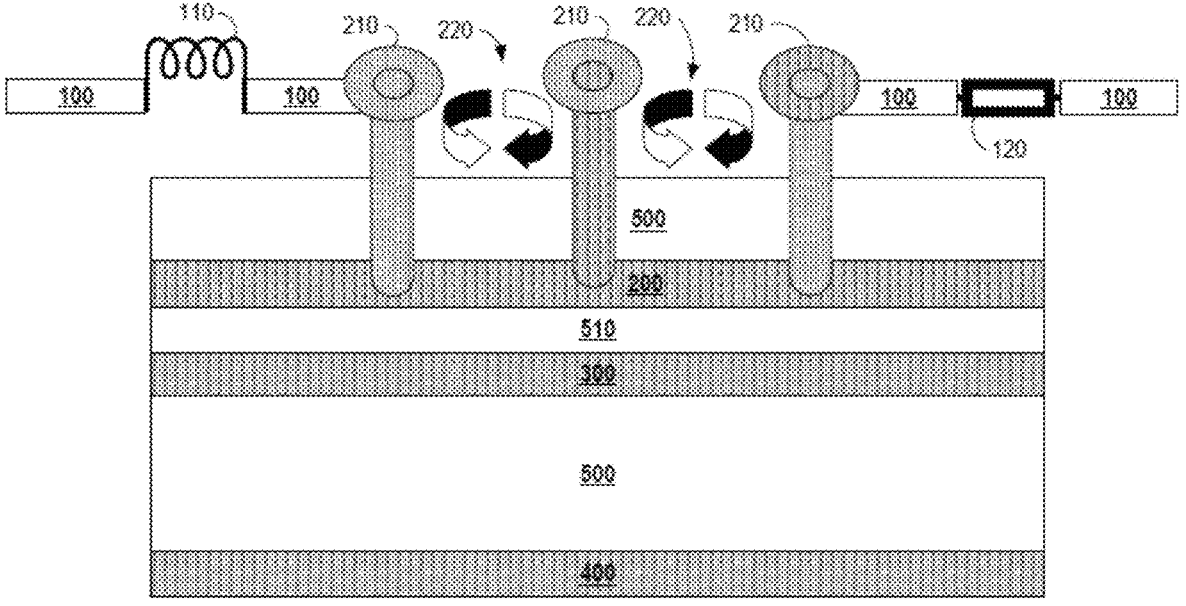
FIG. 3A illustrates one embodiment of a RF Blanking Switch System and having a double diode loop.

FIG. 3A illustrates one embodiment of a RF Blanking Switch System and Apparatus having a double diode loop comprising, consisting, or consisting essentially of a control line 100, coupling layer 200, two vias 210, and a single diode 220, which is broadside coupled to a transmission line 300, ground layer 400, plurality of substrates 500, and a flexible circuit board material 510. Additionally, the control line 100 may further comprise an inductor 110 and a resistor 120. The control line 100 may comprise, consist, or consist essentially of a single direct current voltage, a differential signal, or a digital signal. Again, it is notable that the quantity of the vias 210 and diodes 220 are not so limited and there may be a plurality of diodes 220 each having two vias 210. Furthermore, the three vias 220 may connect two diodes to small metal strips on the coupling layer 200 located directly adjacent the transmission line 300. "Adjacent" comprises a distance where the coupling layer 200 can induce an electromagnetic response in the transmission line 300. When the diodes 220 are switched on, a capacitive coupling from the coupling layer 200 creates an electromagnetic response with the transmission line 330 causing a cancellation or attenuation of two frequency bands along the transmission line. When the two diode 220 is switched on, a capacitive coupling from the coupling layer 200 creates an electromagnetic response with the transmission line 300 causing a cancellation or attenuation of two frequency bands along the transmission line 300. Accordingly, each diode 220 may cause cancellation, blanking, or attenuation of a unique frequency band in the transmission line.

Figure 3B:
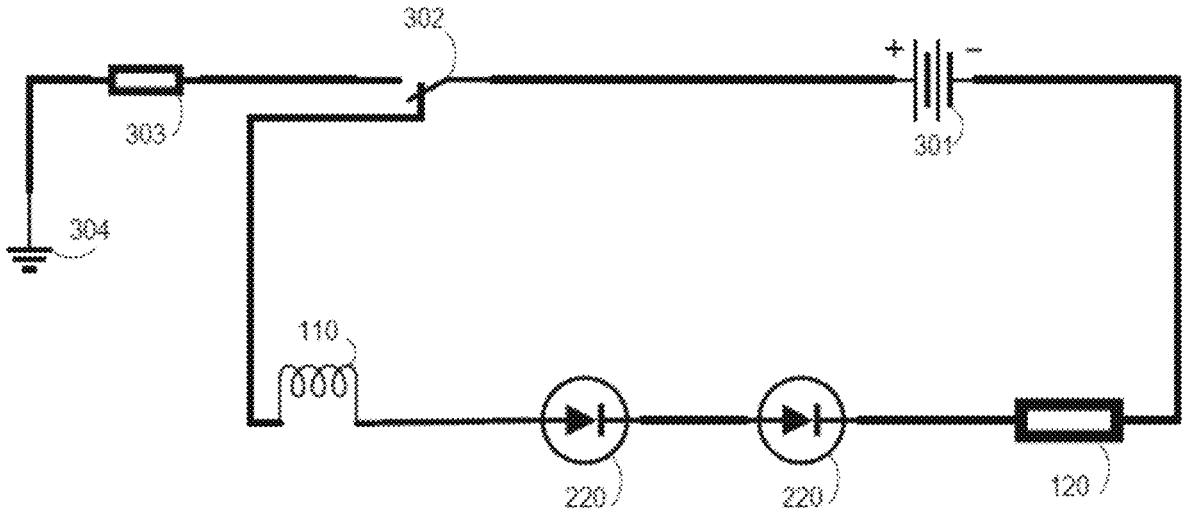
FIG. 3B is an exemplary schematic of a control circuit for turning the diode on and off in a RF Blanking Switch System and Apparatus.

FIG. 3B is an exemplary schematic of a control circuit for turning the two diodes 220 on and off in a RF Blanking Switch System and Apparatus comprising an inductor 110, two diodes 220, a resistor 120, a voltage source 301, a switch 302, second resistor 303, and ground 304. The inductor 110 is electrically connected to the diode in FIG. 3A may be used as a direct current feed for the two diodes 220. The inductor 110, diode 220, and resistor 120 may be place in series as shown in FIG. 3B. The inductor 110 value may be selected to pass only lower frequencies such as DC, which should not affect the coupling loop response of the double diode loop. The resistor 120 on the opposite side of the diode 220 from the inductor 110 is used to limit the direct current to turn on the Diode. The resistor 120 value may be low enough to turn on the diodes, but not low enough to affect the double diode loop.

Figure 3C:
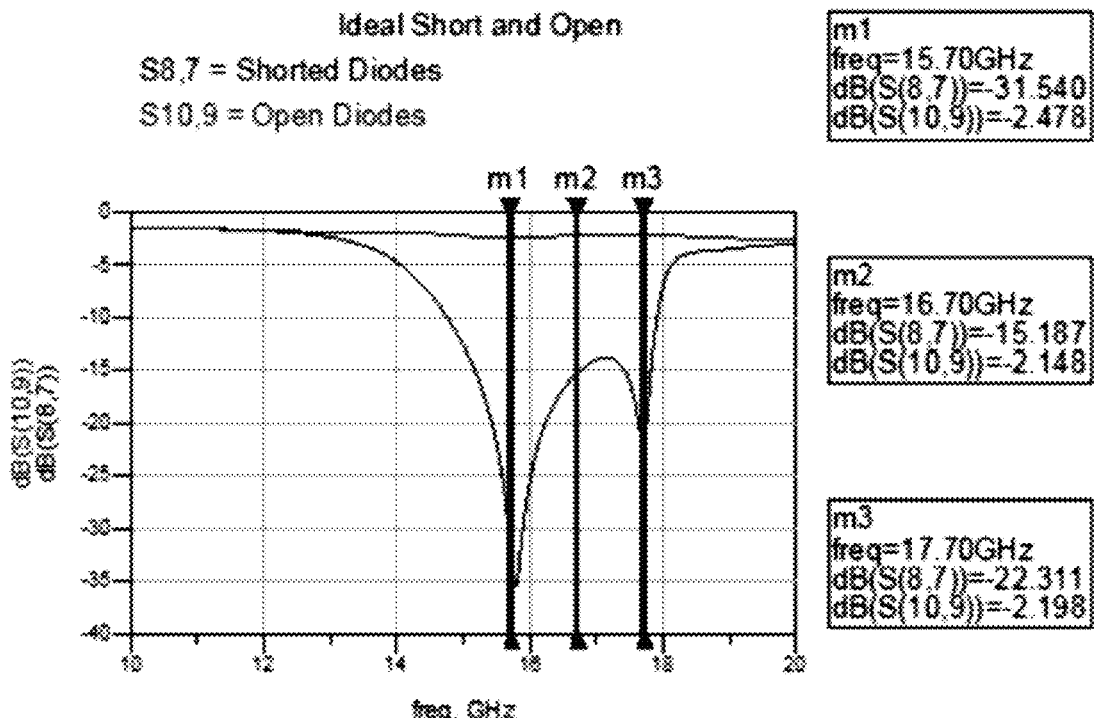
FIG. 3C shows a plot of a double diode simulation response for one embodiment of a RF Blanking Switch System and Apparatus.

FIG. 3C shows a plot of a double diode simulation response for one embodiment of a RF Blanking Switch System and Apparatus having two diodes 220, where the diode 220 was replaced with a short and an open. In this plot, the S10,9 Open Diodes is the upper line while the S8,7 Shorted diodes dip down. This exemplary plot is an extreme ideal response that a diode 220 would have when turned off and on. Again, the shorted diode may be likened to a diode that is on and the open diode may show the response as if the diode was off. Additionally, the design of the diode response may also consider a capacitive response which is different with each model and diode manufacturer. As shown in the FIG. 3C, the shortened ("on") diodes 220 have two negative peaks around frequencies 15.70 GHz at about –35 decibels and 17.70 GHz at –20 decibels.

Figure 3D:
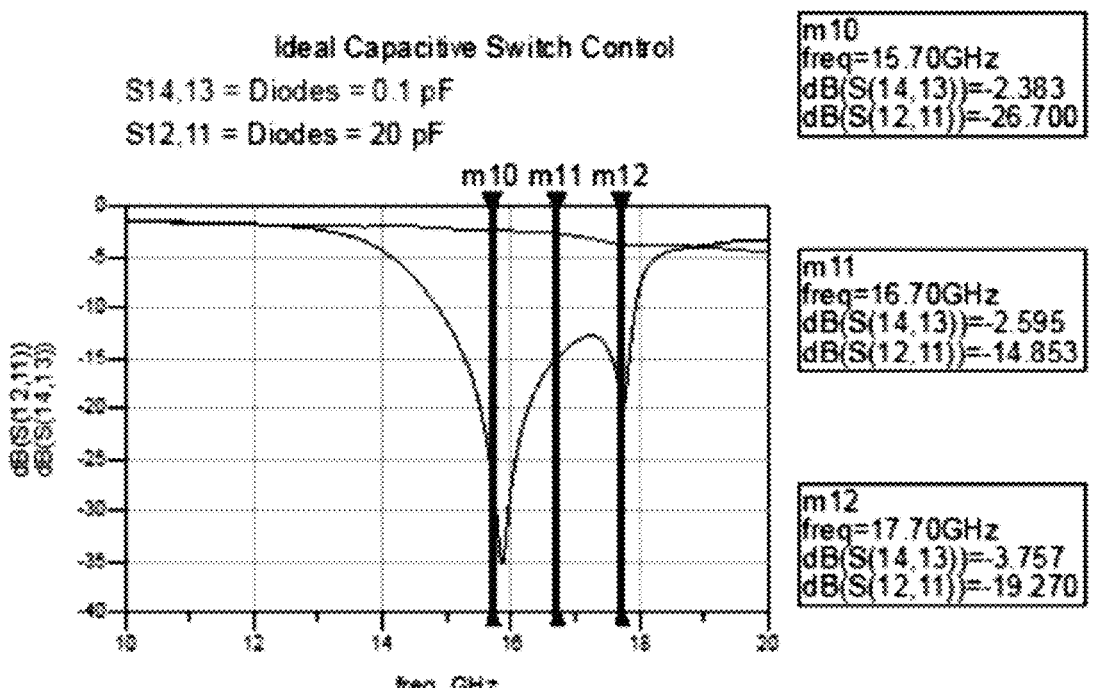
FIG. 3D shows a plot of a double diode simulated response of two diode 220 being replaced with a 20 picofarad (pF) and a 0.1 pF capacitor.

FIG. 3D shows a plot of a double diode simulated response of two diode 220 being replaced with a 20 picofarad (pF) and a 0.1 pF capacitor. In this plot, the S14, 13 0.1 pF Diodes is the upper line while the S12, 11 20 pF diodes dips down. As compared to the plot in FIG. 3C, the 20 pF capacitor in FIG. 2D is similar to the shorted diodes or diode on. The 0.1 pF capacitor in FIG. 3D is similar to the open diode in FIG. 3C or diode off. The combination of the diode capacitance and the coupling effect of the coupling layer 200 may determine the resonant frequency that is being targeting for cancelling, blanking, or attenuation on the transmission line. The double diode loop may support targeting two resonant frequencies. As shown in the FIG. 2D, the response of diode replaced with a 20 pF capacitor have two negative peaks around frequencies 16 GHz at about –35 decibels and 17.70 GHz at –20 decibels.

In an additional embodiment, the RF Blanking Switch System and Apparatus may utilize a plurality of diodes 220 to target a plurality of frequencies to blank or attenuate. The plurality of diodes 220 may target a plurality of frequency bands.

The exemplary plots shown in FIGS. 2C, 2D, 3C, and 3D for the single diode loop and the double diode loops indicate the extreme ideal response of a diode. There are, additionally, multiple variations in between these extremes. For example, when a diode 220 is in its on stage, it has one capacitive value. And when the diode is off or reverse bias, it has another capacitive response. There is also a third capacitive response, when there is no power to the diode. One may also change the capacitive value of the diode 220 by how much direct current you run through the diode when turning it on. The amount of current will determine the capacitance of the diode 220. And again, the operation of the diode 220 may vary by its model type and manufacturer. With a wide variety of diodes 220 to choose and select, one may design a combination that may appropriately target the frequency band to switch or blank.

FIG. 4 is a method of using a radiofrequency blanking switch system 400, the steps comprising: providing a radiofrequency blanking switch, comprising: a control line further comprising a resistor, a plurality of diodes each further comprising two vias, and an inductor electrically connected in series, and a coupling layer electrically connected to each of the vias and broadside coupled to a transmission line, wherein the coupling layer is not physically connected to the transmission line and is close enough to the transmission line for each of the plurality of diodes to induce an electromagnetic response in the transmission line 401; transmitting a transmission signal through the transmission line 402; generating a diode capacitance in each of the plurality of diodes 403; and selectively filtering the transmission signal, wherein a plurality of frequencies bands are cancelled or attenuated in relation to each of the plurality of diode capacitances 404.

From the above description of Radiofrequency Blanking Switch System And Apparatus, it is manifest that various techniques may be used for implementing the concepts of radiofrequency blanking switch system, radiofrequency blanking switch apparatus, and method of using a radiofrequency blanking switch system without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that radiofrequency blanking switch system, radiofrequency blanking switch apparatus, and method of using a radiofrequency blanking switch system are not limited to the particular embodiments described herein, but is capable of many embodiments without departing from the scope of the claims.

What is claimed:

1. A radiofrequency blanking switch system, comprising:
a control line further comprising a resistor, a plurality of diodes each further comprising two vias, and an inductor electrically connected in series; and
a coupling layer electrically connected to each of the vias and broadside coupled to a transmission line, wherein the coupling layer is not physically connected to the transmission line and is close enough to the transmission line for each of the plurality of diodes to induce an electromagnetic response in the transmission line.

2. The radiofrequency blanking switch system of claim 1, wherein the capacitance of each of the plurality of diodes is designed to target a specific frequency band for attenuation or blanking.

3. The radiofrequency blanking switch system of claim 1, wherein the plurality of diodes is a quantity of two.

4. The radiofrequency blanking switch system of claim 1, wherein the control line further comprises a single direct current voltage.

5. The radiofrequency blanking switch system of claim 1, wherein the control line further comprises a differential signal.

6. The radiofrequency blanking switch system of claim 1, wherein the control line comprises a digital signal.

7. A radiofrequency blanking switch apparatus, comprising:
a control line further comprising a resistor, a plurality of diodes each further comprising two vias, and an inductor electrically connected in series; and
a coupling layer electrically connected to each of the vias and broadside coupled to a transmission line, wherein the coupling layer is not physically connected to the transmission line and is adjacent to the transmission line for each of the plurality of diodes to induce an electromagnetic response in the transmission line.

8. The radiofrequency blanking switch apparatus of claim 7, wherein the capacitance of each of the plurality of diodes is designed to target a specific frequency band for attenuation or cancelling.

9. The radiofrequency blanking switch apparatus of claim 7, wherein the plurality of diodes is a quantity of two.

10. The radiofrequency blanking switch apparatus of claim 7, wherein the control line further comprises a single direct current voltage.

11. The radiofrequency blanking switch apparatus of claim 7, wherein the control line further comprises a differential signal.

12. The radiofrequency blanking switch apparatus of claim 7, wherein the control line further comprises a digital signal.

13. A method of using a radiofrequency blanking switch system, the steps comprising:
providing a radiofrequency blanking switch, comprising:
a control line further comprising a resistor, a plurality of diodes each further comprising two vias and a diode capacitance, and an inductor electrically connected in series, and
a coupling layer electrically connected to each of the vias and broadside coupled to a transmission line, wherein the coupling layer is not physically connected to the transmission line and is close enough to the transmission line for each of the plurality of diodes to induce an electromagnetic response in the transmission line;
transmitting a transmission signal through the transmission line;
generating a diode capacitance in each of the plurality of diodes; and
selectively filtering the transmission signal, wherein a plurality of frequencies bands are cancelled or attenuated in relation to each of the plurality of diode capacitances.

14. The method of using the radio frequency blanking switch system of claim 13, the method comprising:
blinkingly attenuating radiofrequency energy within a target band in response to the control voltage.

15. The method of using the radiofrequency blanking switch system of claim 13, wherein the control voltage further comprises a single direct-current bias sufficient to reverse-bias the diode element and thereby blank the transmission line without introducing harmonic distortion.

16. The method of using the radiofrequency blanking switch system of claim 13, wherein the plurality of diodes each comprise a junction capacitance selected to target a specific frequency band for attenuation blanking.

17. The method of using the radiofrequency blanking switch system of claim 13, wherein the plurality of diodes are arranged symmetrically to maintain broadside coupling linearity during switching.

18. The method of using the radiofrequency blanking switch system of claim 13, further comprising monitoring the transmission-line return-loss to verify successful blanking and adjusting the control voltage accordingly.

* * * * *